United States Patent
Lu

(10) Patent No.: US 11,854,235 B1
(45) Date of Patent: Dec. 26, 2023

(54) LOSSLESS INTEGER COMPRESSION SCHEME

(71) Applicant: Marvell Asia Pte Ltd, Singapore (SG)

(72) Inventor: Tao Lu, Northborough, MA (US)

(73) Assignee: Marvell Asia Pte, Ltd., Singapore (SG)

( * ) Notice: Subject to any disclaimer, the term of this patent is extended or adjusted under 35 U.S.C. 154(b) by 393 days.

(21) Appl. No.: 17/197,268

(22) Filed: Mar. 10, 2021

Related U.S. Application Data

(60) Provisional application No. 63/011,190, filed on Apr. 16, 2020.

(51) Int. Cl.
| | | |
|---|---|---|
| *G06K 9/36* | (2006.01) | |
| *G06T 9/00* | (2006.01) | |
| *H03M 7/30* | (2006.01) | |
| *G06T 3/40* | (2006.01) | |

(52) U.S. Cl.
CPC ............... *G06T 9/00* (2013.01); *G06T 3/40* (2013.01); *H03M 7/3059* (2013.01); *H03M 7/3071* (2013.01)

(58) Field of Classification Search
CPC .............. G06T 9/00; G06T 9/05; G06T 9/07
See application file for complete search history.

(56) References Cited

U.S. PATENT DOCUMENTS

| | | | | |
|---|---|---|---|---|
| 2013/0251256 A1* | 9/2013 | Deng | .................... | H04N 19/136 |
| | | | | 382/166 |
| 2013/0262538 A1* | 10/2013 | Wegener | ................. | H03M 7/30 |
| | | | | 708/203 |
| 2019/0051017 A1* | 2/2019 | Beek | ....................... | G06T 7/521 |

OTHER PUBLICATIONS

Di et al., "Fast Error-bounded Lossy HPC Data Compression with SZ", Argonne National Laboratory, University of Illinois, IEEE International Parallel and Distributed Processing Symposium (IPDPS), 2016.

Peter Lindstrom., "Fixed-Rate Compressed Floating-Point Arrays", IEEE Transactions on Visualization and Computer Graphics, vol. 20, Issue 12, Aug. 2014.

* cited by examiner

*Primary Examiner* — Duy M Dang
(74) *Attorney, Agent, or Firm* — Young Basile Hanlon & MacFarlane, P.C.

(57) ABSTRACT

Decompressing a compressed image to obtain a decompressed image includes receiving, in a compressed stream, compressed pixel values of the compressed image; decompressing, from the compressed stream, a first compressed pixel value of the compressed pixel values using a lossy floating-point decompression scheme to obtain a floating-point pixel value; rounding the floating-point pixel value to a nearest integer to obtain a pixel value of the decompressed image; and displaying or storing the decompressed image.

26 Claims, 5 Drawing Sheets

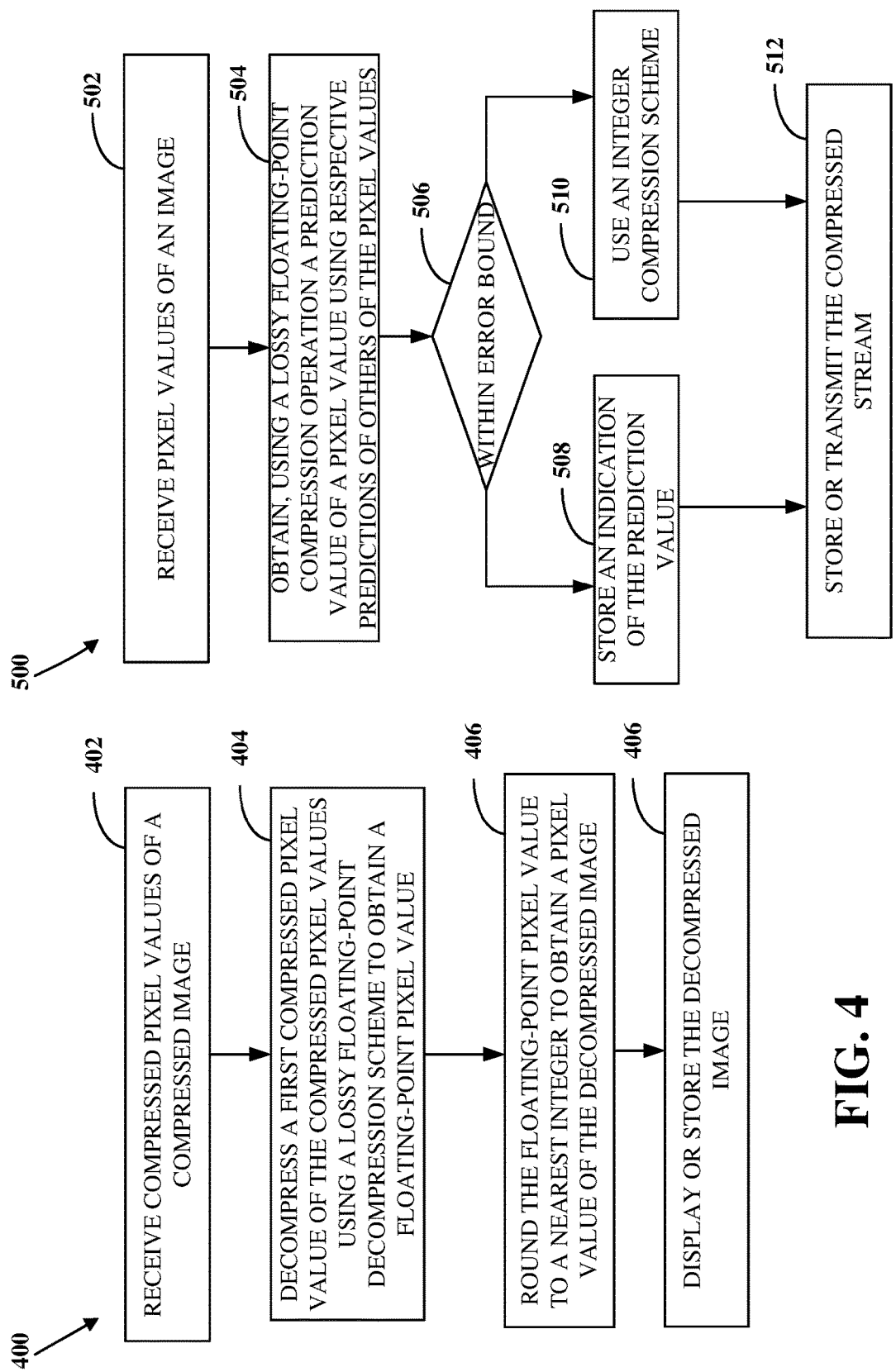

LOSSLESS INTEGER COMPRESSION SCHEME

CROSS-REFERENCE TO RELATED APPLICATION(S)

This application claims priority to and the benefit of U.S. Provisional Application Patent Ser. No. 63/011,190, filed Apr. 16, 2020, the entire disclosure of which is hereby incorporated by reference

TECHNICAL FIELD

This disclosure relates generally to data compression and more specifically to compression and decompression of integer values.

BACKGROUND

An enormous amount of data is generated, stored, retrieved, and/or transmitted each instant of each day. Estimates are that 2.5 quintillion bytes of data are created every day, and this number is increasing. For example, hundreds of millions of photos and videos are uploaded, shared, streamed, and/or viewed (e.g., downloaded and viewed) each day. For example, billions of connected devices (e.g., Internet-of-Things devices) transmit data collected by their sensors to centralized locations for storage and analysis. For example, high-precision numerical computer simulations, observations, and experiments (such as climate simulations and genome mapping) produce and require a significant amount of data that are represented as floating point values and can easily require terabytes to petabytes of storage. The storage capacity required to store such large amounts of data can be prohibitively costly.

Another problem relates to the growing gap between compute bandwidth and input/output (I/O) (e.g., secondary storage) access bandwidth. Thus, performance of computations can be limited by the amount of data movement to/from compute cores, such as central processing units (CPUs) or graphical processing units (GPUs). This bandwidth gap between compute and I/O is getting larger year by year.

Therefore, techniques for compressing data at high compression ratios and rates can reduce the storage, retrieval, and transmission bandwidths required.

SUMMARY

Disclosed herein are implementations of compression and decompression of integer values.

A first aspect of the disclosed implementations is a method for decompressing a compressed image to obtain a decompressed image. The method includes receiving, in a compressed stream, compressed pixel values of the compressed image; decompressing, from the compressed stream, a first compressed pixel value of the compressed pixel values using a lossy floating-point decompression scheme to obtain a floating-point pixel value; rounding the floating-point pixel value to a nearest integer to obtain a pixel value of the decompressed image; and displaying or storing the decompressed image.

A second aspect of the disclosed implementations is an apparatus for compressing an image to obtain a compressed image. The apparatus includes a processor that is configured to receive pixel values of the image; obtain, using a lossy floating-point compression scheme, a prediction value of a pixel value of the pixel values using respective predictions of others of the pixel values; on a condition that a difference between the prediction value and the pixel value is within an error bound, store an indication of the prediction value in a compressed stream; on a condition that the difference is not within the error bound, use an integer compression scheme to compress the pixel value in the compressed stream; and store or transmit the compressed stream.

A third aspect of the disclosed implementations is a non-transitory computer-readable storage medium that includes executable instructions that, when executed by a processor, facilitate performance of operations for compressing integer values. The operations include operations to receive the integer values; compress a first subset of the integer values using a lossy floating-point compression scheme that uses an error bound that is less than 0.5 to obtain a first compressed subset; and store the first compressed subset in a compressed stream or file.

A fourth aspect is an apparatus for compressing an image to obtain a compressed image. The apparatus includes means for processing the image and a means for outputting the compressed image. The processing includes to receive pixel values of the image; obtain, using a lossy floating-point compression scheme, a prediction value of a pixel value of the pixel values using respective predictions of others of the pixel values; on a condition that a difference between the prediction value and the pixel value is within an error bound, store an indication of the prediction value in a compressed stream; and, on a condition that the difference is not within the error bound, use an integer compression scheme to compress the pixel value in the compressed stream. Means for outputting includes storing or transmitting the compressed stream.

It will be appreciated that aspects can be implemented in any convenient form. For example, aspects may be implemented by appropriate computer programs which may be carried on appropriate carrier media which may be tangible carrier media (e.g. disks) or intangible carrier media (e.g. communications signals). Aspects may also be implemented using suitable apparatus which may take the form of programmable computers running computer programs arranged to implement the methods and/or techniques disclosed herein. Aspects can be combined such that features described in the context of one aspect may be implemented in another aspect.

BRIEF DESCRIPTION OF THE DRAWINGS

The disclosure is best understood from the following detailed description when read in conjunction with the accompanying drawings.

FIG. 4 is a flowchart of a technique for decompressing a compressed image to obtain a decompressed image according to an implementation of this disclosure.

FIG. 5 is a flowchart of a technique for compressing an image to obtain a compressed image according to an implementation of this disclosure.

DETAILED DESCRIPTION

Figure 1:
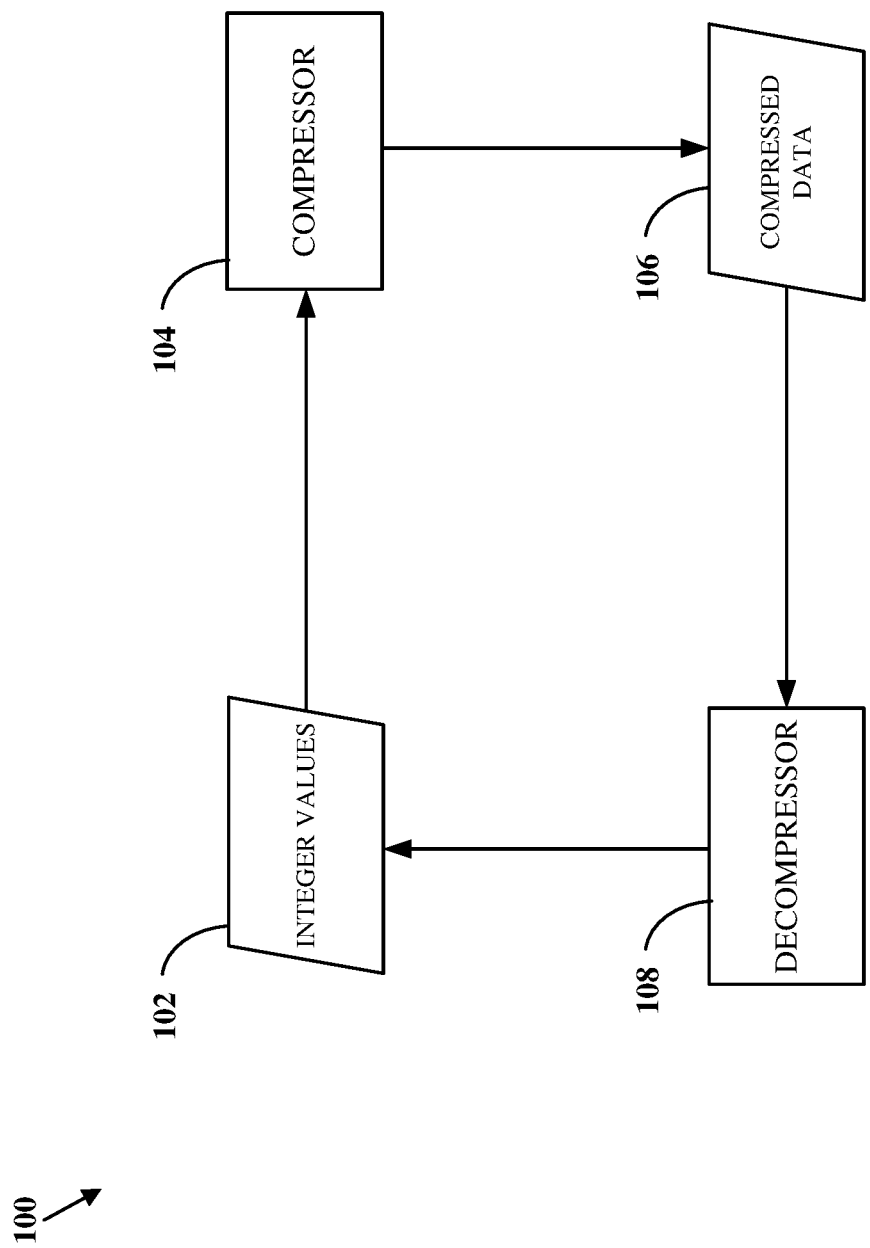
FIG. 1 is an example of a system for compressing and decompressing a set of integer values according to implementations of this disclosure.

Data compression (i.e., coding) can be used to compress (i.e., encode) information using fewer bits than the original, source information. A general property of the Shannon entropy theory is that redundancy does not add new information. Thus, compression schemes effectively exploit and eliminate redundancy in a data set.

From information theory, the entropy $H(X)$ can be a measure of the number of bits required to code the variable X; and the conditional entropy $H(X|Y)$ can be a measure of the number of bits required to code the variable X given that the quantity Y is known. $H(X)$ and $H(X|Y)$ are related by the well-known property $H(X|Y)<H(X)$. That is, the conditional entropy $H(X|Y)$ can never exceed $H(X)$. To illustrate, and without loss of generality, if X represents a value in an ordered data set and Y represents one or more of the values preceding X in the data set, it follows that coding of the value (i.e., X) may be improved by using the preceding values (i.e., Y) and/or known information or properties of the preceding values.

Many compression schemes (e.g., techniques, mechanisms, algorithms, operations, etc.) have been developed to compress different types of data. Compression schemes can be lossy or lossless. Reversible data compression is usually conducted in a lossless way therewith dramatically increasing the Shannon entropy and resulting in relatively low compression ratios. In lossless compression schemes, the original data can be perfectly reconstructed from the compressed data.

Lossy compression algorithms have been proposed to dramatically reduce the size of data, but at the cost of discarding some relatively insignificant data. In lossy compression schemes, the original data cannot be exactly reproduced from the compressed data. Lossy compression schemes can only reproduce approximations of the original data.

Examples of lossless compression techniques (such as for encoding integer values) include run-length encoding, prefix-encoding, Lempel-Ziv-Welch (LZW), DEFLATE, arithmetic coding, progressive arithmetic coding, entropy coding, Huffman coding, other variable-length encoding, and so on. Examples of lossy compression techniques (such as for floating-point values) include quantization, the Squeeze (SZ) scheme (described below), and the ZFP scheme, which is described in P. Lindstrom, "Fixed-rate compressed floating-point arrays," *IEEE Transactions on Visualization and Computer Graphics*, vol. 20, no. 12, pp. 2674-2683, 2014. A person skilled in the art of compression is familiar with such techniques and descriptions of these techniques is not necessary herein. However, a few examples are provided by way of examples.

Run-length encoding encodes the number of times a symbol is seen followed by the symbol itself. For example, the string 0111111111110 may be encoded as 1012110 (i.e., 1 occurrence of the zero symbol, followed by 12 occurrences of the one symbol, followed by 1 occurrence of the zero symbol).

Entropy coding is a technique for lossless coding that relies upon probability models that model the distribution of values in a data set. For example, in the field of image or video compression, the probability models can model the distribution of values occurring in a region of the image being encoded. By using probability models (i.e., probability distributions) based on a measured or estimated distribution of values, entropy coding can reduce the number of bits required to represent data (e.g., image or video data) close to a theoretical minimum. In practice, the actual reduction in the number of bits required to represent image or video data can be a function of the accuracy of the probability model, the number of bits over which the coding is performed, and the computational accuracy of fixed-point arithmetic used to perform the coding. A probability distribution can be used by an entropy coding engine, such as arithmetic coding, Huffman coding, and other variable-length-to-variable-length coding engines.

In arithmetic coding, it is possible to use less than one bit per symbol using range encoding or Asymmetric Number Systems (ANS) coding. The symbols can be the bit values 1 and 0.

When it comes to floating-point data, lossless compression is not likely to be effective because of the randomness of the representation of the floating-point data. By "not likely to be effective" is meant that the compression ratio is likely to be fairly low. On the other hand, lossy compression techniques of floating-point data can result in high compression ratios. As mentioned above, quantization is one example of lossy compression of floating-point data in which a floating-point value is mapped (e.g., constrained to) a discrete set, such as a discrete set of integers.

Another lossy technique for coding floating-point numbers is the Squeeze (SZ) mechanism, which is described in S. Di and F. Cappello, "Fast error-bounded lossy hpc data compression with SZ," in 2016 *IEEE International Parallel and Distributed Processing Symposium*, IEEE, 2016, pp. 730-739. SZ can be summarized as follows.

In SZ, multiple prediction models (e.g., curve fitting models) may be used for predicting a next value in a data set based on predictions of previous values of the data set. For example, three prediction models may be available and indicated in a compressed stream using, respectively, the codewords 00, 01, and 10. A next floating-point value can be estimated using the available prediction models using previously coded floating-point values as inputs to the models. The models can have different or the same number of inputs. If one of the prediction models (e.g., the second prediction model indicated by the codeword 01) estimates the floating-point value to within a defined (e.g., set, pre-selected, etc.) error bound of the original floating-point value, then the indication of the prediction model (e.g., 10) is encoded for the floating-point value. If the floating-point value cannot be predicted to within the error bound by any of the prediction models, then the floating-point value is itself written to the compressed stream along with an indication (e.g., the codeword 11) that floating-point value could not be successfully estimated using any of the available prediction models.

Some compression schemes store or transmit a delta (e.g., a difference) between an original value and a predicted (e.g., compressed) value. For example, video compression schemes (e.g., AV1, HEVC, AVC, etc.) may include breaking each image, or frame, into smaller portions, such as blocks, and generating an output bitstream using techniques to limit the information included for each block in the output. An encoded bitstream can be decoded to re-create the source images from the limited information. The information included for each block in the output may be limited by reducing spatial redundancy, reducing temporal redundancy, or a combination thereof. Temporal or spatial redundancies may be reduced by predicting a frame based on information available to both the encoder and the decoder, and including information representing a difference (also referred to as a residual) between the predicted frame and the original frame.

However, for some data types, an error can be easily corrected without storing the delta between the original and the compressed data. For example, using an integer as an example, if the absolute error of predicting the integer is controlled during compression, then the original value of the integer can be easily recovered. Implementations of this disclosure can use lossy floating-point compression schemes with controlled error bounds to losslessly compress integer data (i.e., values).

To illustrate and without loss of generality, take the integer value 12. During compression (such as using the SZ scheme), the integer may be predicted to be, and is encoded as being predicted as, 12.2 using an absolute error bound that is controlled to be less than, but close to, 0.5 (e.g., 0.4999999 . . . ). A decoder (i.e., a decompressor) can simply obtain (i.e., calculate using the prediction model, etc.) the prediction 12.2 and round (e.g., using the half round down method) the 12.2 predicted value to obtain the original integer value 12. Similarly, if the integer is predicted to be 11.7, then simply rounding (e.g., using the half round up method) the 11.7 results in the original integer value 12.

Implementations according to this disclosure can dramatically improve the compression ratio of integer sequences by using (e.g., leveraging) a lossy floating-point compression scheme for compressing integer data, or a portion thereof. Examples of lossy floating-point compression schemes that can be used according to implementations of this disclosure include SZ and ZFP. However, the disclosure is so limited and any lossy floating-point compression scheme that uses an absolute error bound of approximately 0.5 can be used to losslessly compress integer values according to implementations of this disclosure.

As a non-limiting example of the compression performance that can be achieved using the techniques disclose herein, whereas an original image compressed using the Portable Network Graphics (PNG) file format (which uses a compression algorithm that is based on the Deflate algorithm) may be compressed by a factor of 10×, the techniques described herein can losslessly compress the image by a factor of 45× therewith dramatically outperforming the compression ratio of PNG. Again, this is just an example, and the compression ratios that can be achieved are image-data (e.g., image format) independent and application independent. The techniques described herein can be used in many applications or application domains/fields including multi-media encoding, databases, high-performance computing, and medical image storage, to name a few. Artisans of ordinary skill in the related arts will readily appreciate that the principles described herein may be broadly applied in many domains where data compression may be useful.

Compressing integer data (e.g., values) using the techniques describes herein can result in high compression ratios that are equivalent to those of lossy compression schemes but without sacrificing data fidelity (e.g., accuracy). That is, the compression of the lossless compression schemes describes herein can be equivalent to the compression ratios of lossy compression techniques. To illustrate, assume that the integer values are pixel values of a color channel (e.g., the red, the blue, the green color channel, or some other channel) of pixels of an image each represented using 8-bits. As such, each integer value can be in the range [0, 255]. If these integer values are compressed using a lossy floating-point compression scheme with an absolute error bound of 0.5, which means that the error can be in the range of (−0.5, 0.5), then the compression scheme can be completely tolerant to a minimum error of $(0.5-(-0.5))/255 \approx 0.4\%$. The closer the absolute error bound is to 0.5, the greater the compression ratio would be expected to be; and the narrower the range of pixel values in the image, the higher the relative error tolerance.

Typically, a pixel value of a color image may be represented using separate values for each of the color components of the color space (e.g., the RGB color space, the YCbCr color space, etc.) that is used. As such, a pixel value may actually be a vector of numbers (e.g., 3 numbers for each of the red, green, and blue color channels). However, as used herein, a pixel value may be used to indicate one or more (e.g., all) of the color channel values.

FIG. 1 is an example of a system 100 for compressing and decompressing a set of integer values according to implementations of this disclosure. The system 100 includes a compressor 104 and a decompressor 108. The compressor 104 may also be referred to as an encoder. The decompressor 108 may also be referred to as a decoder. In some implementations, the system 100 can include other modules.

Figure 6:
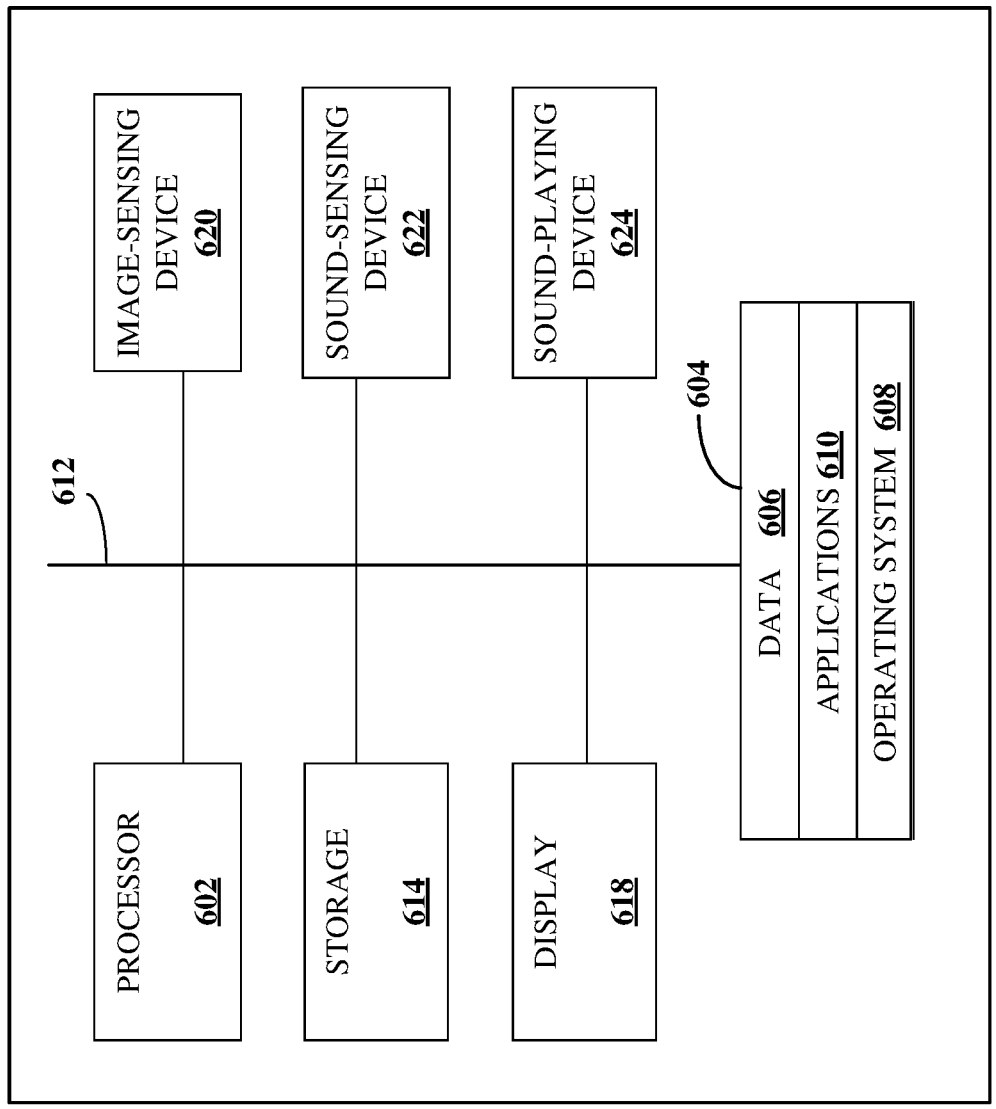
FIG. 6 is a block diagram of an example of a computing device in accordance with implementations of this disclosure.

The compressor 104 can be implemented, for example, as a software program that may be executed by a first computing device, such as a computing device 600 of FIG. 6. The software program can include machine-readable instructions (e.g., executable instructions) that may be stored in a memory such as a memory 604 or a secondary storage 614, and that, when executed by a processor, such as a CPU 602, may cause the computing device to perform the functions of the compressor 104. The software program can be stored on a non-transitory computer-readable storage medium. The compressor 104 can be implemented using specialized hardware or firmware. Multiple processors, memories, or both, may be used.

The decompressor 108 can be implemented, for example, as a software program that may be executed by a second computing device, such as the computing device 600 of FIG. 6. The software program can include machine-readable instructions that may be stored in a memory such as the memory 604 or the secondary storage 614, and that, when executed by a processor, such as the CPU 602, may cause the computing device to perform the functions of the decompressor 108. The software program can be stored on a non-transitory computer-readable storage medium. The decompressor 108 can be implemented using specialized hardware or firmware. Multiple processors, memories, or both, may be used.

In an example, the compressor 104 and the decompressor 108 may be modules of a same system that performs both compression and decompression functions. In an example, the compressor 104 and the decompressor 108 may be modules of different systems. For example, the compressor 104 and the decompressor 108 may each be implemented by a respective communication device that is configured to transmit or receive wired or wireless communication signals that include integer data and can include a user equipment (UE), a mobile station, a fixed or mobile subscriber unit, a cellular telephone, a personal computer, a tablet computer, a server, consumer electronics, or any similar device.

The compressor 104 receives integer values 102 and compresses them into a compressed data 106. The compressor 104 compresses the integer values 102 using the compression schemes described herein. That is, the compressor 104 uses an error-bound lossy floating-point compression scheme to compress the integer values 102. As further described below, the compressor 104 may not compress at least some of the integer values of the integer values 102 using the error-bound lossy floating-point compression scheme and uses instead a (lossless) integer compression scheme for those integer values. However, for ease of reference, that the compressor 104 uses an error-bound lossy floating-point compression scheme to compress the integer values 102 encompasses a first situation where all of the integer values 102 are compressed using the error-bound lossy floating-point compression scheme, and a second situation where a first subset of the integer values 102 is compressed using the error-bound lossy floating-point compression scheme and a second subset of the integer values 102 is compressed using an integer compression scheme.

The decompressor 108 receives the compressed data 106 and decompresses them to obtain the original (i.e., copies of) the integer values 102. The decompressor 108 decompresses the compressed data 106 using the decompression schemes described herein. That is, the decompressor 108 uses the error-bound lossy floating-point compression scheme to decompress the compressed data 106. For ease of reference, that the decompressor 108 uses an error-bound lossy floating-point compression scheme to decompress the compressed data 106 encompasses a first situation where all of the compressed integer values of the compressed data 106 are decompressed using the error-bound lossy floating-point compression scheme, and a second situation where a first subset of the compressed integer values is decompressed using the error-bound lossy floating-point compression scheme and a second subset of the compressed integer values is decompressed using an integer decompression scheme.

The integer values 102 can be any set of integer values received from anywhere. In an example, the integer values 102 may be included in other received content from which the integer values 102 are the extracted and provided (e.g., input, presented, etc.) to the compressor 104. Integer data is generated and/or is present in many different applications and domains. Thus, the techniques described herein can be used in any application or domain where it is desirable to compress integer data. A few, non-limiting examples of applications of compressing integer data are described herein.

In an example, the integer values 102 can be sensor data received from internet-of-things devices and the compressor 104 can be part of a centralized system that receives the integer values 102 and compresses the data to obtain the compressed data 106 for storage. In another example, the integer values 102 may be compressed by the compressor 104 at the source of the integer data before transmitting the compressed data 106 to the centralized location. In an example, the integer values 102 can be data received from a wearable device (e.g., a wearable watch) by a device (e.g., a portable device, a personal computer, etc.) that is connected (e.g., wirelessly or wiredly connected) to the wearable device. In an example, the portable device can compress the integer values 102 and transmit the compressed data 106 to the device.

As is known, database compression can be used to save disk space and improve performance of a workload-intensive database by reducing the number of pages and queries needed to read those fewer pages from disk (e.g., secondary storage). Database compression techniques can be used to compress actual data stored in the database and/or to compress derived entities, such as indices, views, clusters, heaps, or other such derived entities. As such, the compressor 104 and the decompressor 108 can be used to, respectively, compress and decompress integer data in a database and/or in one or more derived entities of the database.

In an example, the compressor 104 may be executed in response to a data definition language (DDL) command to the database. The DDL command may be a create command (such as to create a table or an index), an alter command, or a backup command. For example, in response to a backup command, the compressor 104 can be invoked to compress integer data in the entities (e.g., tables) being backed up to obtain the compressed data 106, which become part of the backed up data. For example, in response to a restore DDL command, a query command, or the like, the decompressor 108 can be invoked to decompress the compressed integer values (or a portion thereof) or compressed index data. In another example, the compressor 104 may be invoked wherever an index on an integer column is updated.

As another example, the integer values 102 can be pixel values of an image, which may be a frame of a video stream. References to "pixel value" can be understood to mean, as the context makes clear, the pixel value of at least one of the color components of the pixel. For example, in a case where the RGB color system is used, "pixel value" can mean, the red value of the pixel, the green value of the pixel, the blue value of the pixel, or a combination thereof. In the case where the YUV color system is used, then "pixel value" can mean, the luminance (i.e., Y) value of the pixel, one of the color-difference chrominance components (i.e., U and/or V), or a combination thereof. As such, "pixel value" can be one or more color component values. "Pixel" can also refer to the value of a color component of a pixel at a location (e.g., Cartesian coordinates) of an image or a block of the image.

In an example an image or a portion (e.g., a block, a segment, a tile, etc.) of an image (collectively, image data) may be received by the system 100. The image data includes raw pixel values. As mentioned above, each pixel value can include multiple color channel values. In an example, the integer values of each of the color values can be extracted and stored separately in a data structure (e.g., a vector). As is known, the image data can be 2-dimensional. As such, a scanning order can be used to traverse the 2-dimensional structure to convert it into a one dimensional structure constituting the integer value 102 to be compressed by the compressor 104. The scanning order can be a raster scan order, a zig-zag scan order, a vertical scan order, a horizontal scan order, or any other scan order known in the art. The color channel data of multiple images with the same pixel structure can be treated as 3-dimensional integer arrays. For multi-dimensional data, sequentialization techniques, such as vertical and horizontal scanning, can be applied to transform the data into one-dimensional data. Encoding can then be conducted on the transformed sequential data. Alternatively, multi-dimensional encoding techniques can be directly applied to encode the multi-dimensional data, as long as the error bound is guaranteed.

The compressor 104 can encode each color channel data (e.g., vector) using a lossy floating-point compression scheme with a point-wise absolute error bound of less than 0.5. A compressed stream (e.g., respective compressed data 106) can be generated for each of the color channels. The decompressor 108 can decompress the respective compressed color channel streams using a lossy floating-point decompression operation. A decompressed floating-point value stream is generated for each color channel. Each decompressed value has a point-wise absolute error bound of less than 0.5, which is guaranteed in the compression procedure used by the compressor 104. A decompressed floating-point value is rounded to its nearest integer to obtain an integer value, which is guaranteed to be the corresponding original color channel value. As such, with every color channel decompressed, the raw pixel stream can be restored in a lossless way.

In an illustrative example, the image data can be an original image that is to be accessed from a website. The website owner can compressed the image data using the compressor 104. A web browser that downloads the compressed image uses the decompressor 108 to decompress the image before displaying it.

Figure 2:
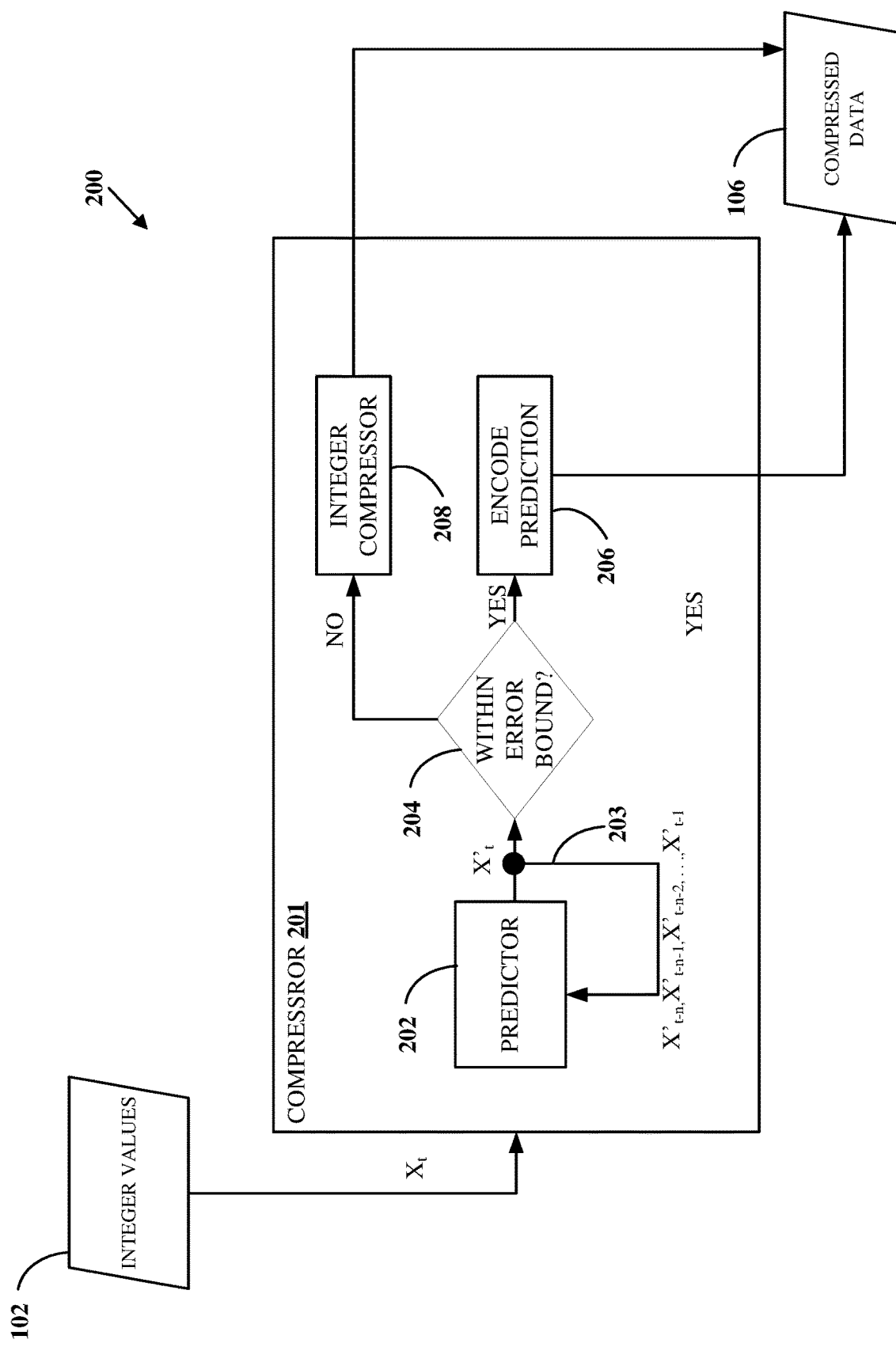
FIG. 2 is a flowchart of a technique for integer compression according to an implementation of this disclosure.

FIG. 2 is a flowchart of a technique 200 for integer compression according to an implementation of this disclosure. The technique 200 can be implemented by a compressor 201, which can be the compressor 104 of FIG. 1.

The technique 200 can receive the integer values 102 of FIG. 1. The integer values 102 can be processed one integer value at a time. A current integer value $X_t$ can be predicted by a predictor 202 to obtain a prediction $X'_t$. The predictor 202 can use one or more previously predicted values $X'_{t-n}$, $X'_{t-n-1}, X'_{t-n-2}, \ldots, X'_{t-1}$ to obtain $X'_t$, which is a prediction of current integer value $X_t$. The predictor 202 can include (e.g., use, etc.) one or more prediction techniques (i.e., models). The prediction models can be regression models, curve fitting models, other types of prediction models, or a combination thereof. In an example, one or more of the curve fitting models of SZ may be used. SZ describes a preceding neighbor fitting (PNF) model, a linear-curve fitting (LCF) model, and a quadratic-curve fitting (QCF) model. In another example, the predictor 202 can be any other regression model, such as a neural network model. In the case that multiple prediction models are available in the predictor 202, then a respective prediction $X'_t$ can be obtained for at least some (e.g., all) of the available models. Each of the predictions $X'_t$ can then be tested as described below.

It is noted that the first few integer values of the integer values 102, which are needed for prediction (e.g., curve fitting), may be output to the compressed data 106 as is (e.g., in raw form). In an example, the number of the first few integer values can be stored in raw form relate to the number of inputs of the prediction models. In another example, those first few integer values can be encoded using a lossless integer compression scheme. As shown by an arrow 203, the prediction $X'_t$ of the current integer value is used by the predictor 202 in predicting the next integer value $(X_{t+1})$ that follows the current integer value $(X_t)$.

At 204, the technique 200 determines whether the prediction $X'_t$ is within the error bound. As mentioned above, the absolute error bound can be close to, but not greater than, 0.5. Thus, the technique 200 determines whether $|X'_t - X_t| <$ error bound. If so, then the technique 200 proceeds to 206. At 206, the technique 200 can encode an indication of the prediction model used to predict the current integer value $X_t$. If the prediction is not within the error bound, then the technique 200 proceeds to 208 to losslessly encode the current integer value $X_t$ in the compressed data 106 along with an indication that the current integer value $X_t$ was not encoded using a prediction of the predictor 202.

To illustrate and without loss of generality, the lossless scheme may be a variable-length encoding scheme, such as a Huffman coding scheme. As such, the technique 200 can include (e.g., output, write, etc.) the Huffman codes in the compressed data. In another example, a Huffman code may be selected from a set of available codes and the compressor can include an indication (e.g., an index) of the Huffman code in the compressed data 106. In yet another example, the compressor can encode the integers values using several possible lossless compression schemes and then selects the scheme corresponding to the fewer number of encoding bits. The integers can then be actually encoded in the compressed data 106 using the selected scheme. The compressor then includes an indication of the scheme and any parameters of the scheme in the compressed data 106 so that a decompressor can use the corresponding scheme in decoding the integer data. To illustrate and without loss of generality, the indication of the scheme can indicate that arithmetic encoding is to be used and the parameters can be or can indicate the probability distribution to use; or the indication of the scheme can indicate that differential coding is used.

As mentioned, predictions of previous integer values are used by the predictor 202 to predict a current value. In the case that an integer is losslessly encoded, then the prediction of $X'_t$ of $X_t$ can be set $X'_t = X_t$. In another example, one of the available prediction models may be set as a default predictor. In such a case, the prediction $X'_t$ of the default prediction model can be used.

As mentioned above, a respective indication (e.g., a 2-bit codeword: 00, 01, or 10) can be associated with each of the available prediction models (e.g., three prediction models) that the predictor 202 uses and an indication (e.g., 11) can be associated with the fact that an integer could not be predicted by any of the available models. As such, the compressed data 106 can include bit sequences, which can themselves be further encoded using a lossless compression scheme. To illustrate, the compressed data 106 can include the bit sequence . . . 000010101111 . . . indicating that six consecutive integers of the integer values 102 were encoded using, respectively, the first prediction model, the first prediction model, the third prediction model, the third prediction model, lossless encoding, and lossless encoding. In an example, run-length encoding can be used to encode the bit sequence.

The integers that could not be predicted to within the error bound by the predictor 202 are losslessly compressed in the compressed data 106 using any lossless integer compression scheme. In an example, the compressed data 106 can be partitioned into two sub-streams: one sub-stream containing the indicators described above and a second sub-stream that includes the losslessly compressed integer values.

Figure 3:
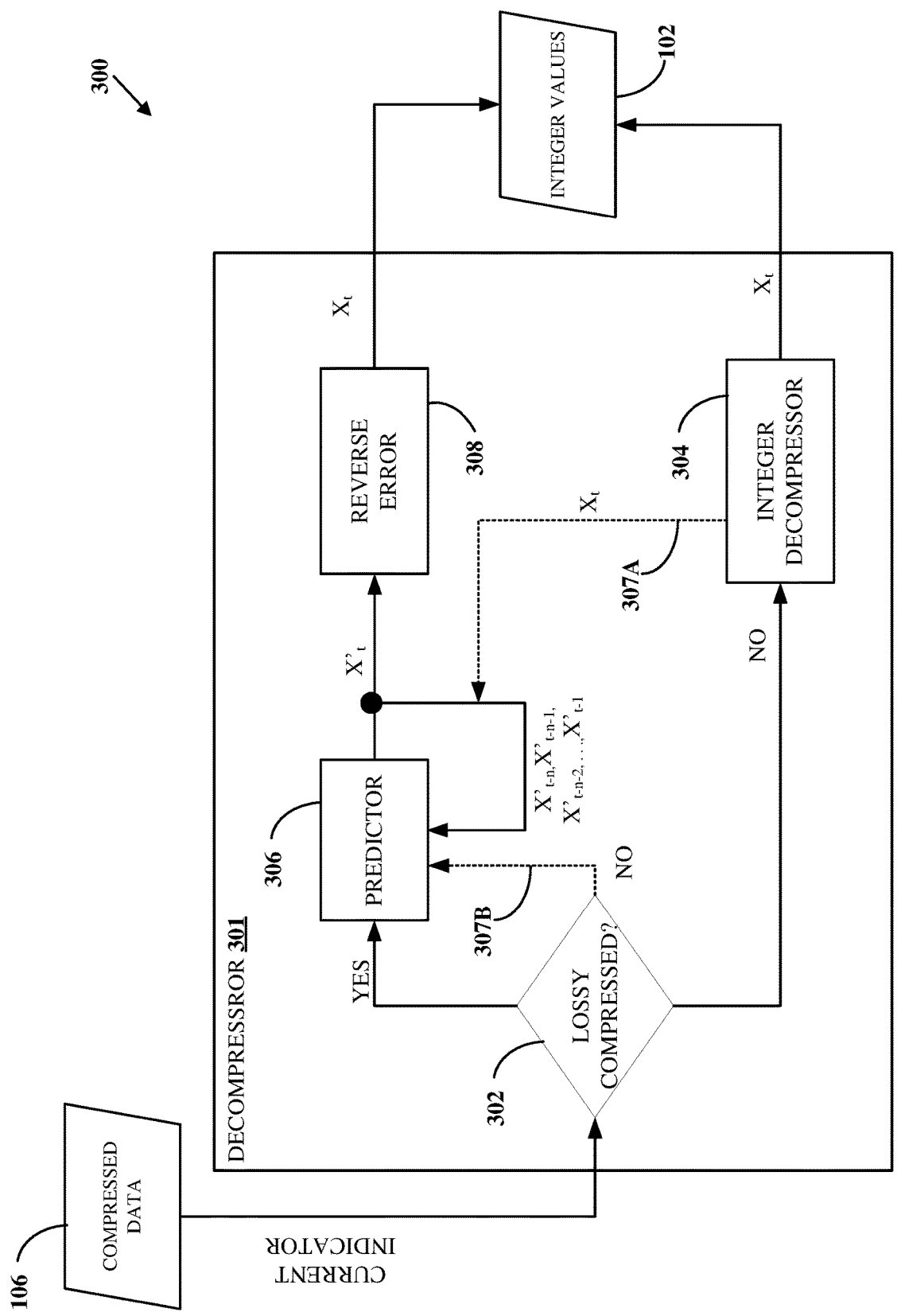
FIG. 3 is a flowchart of a technique for integer decompression according to an implementation of this disclosure.

FIG. 3 is a flowchart of a technique 300 for integer decompression according to an implementation of this disclosure. The technique 300 can be implemented by a decompressor 301, which can be the decompressor 108 of FIG. 1. The technique 300 decompresses the compressed data 106 to obtain the integer values 102.

The technique 300 uses a predictor 306, which can be or can be similar to the predictor 202 of FIG. 2. The predictor 306 predicts a value $X'_t$ of a current integer value $X_t$. As described above with respect to FIG. 2, the predictor 302 uses one or more previously predicted values $X'_{t-n}$, $X'_{t-n-1}$, $X'_{t-n-2}, \ldots, X'_{t-1}$ to obtain $X'_t$.

The technique 300 obtains (e.g., reads, etc.) a current indicator from the compressed data 106. As illustrated above, the current indicator can be a codeword (e.g., a two-bit codeword). At 302, the technique 300 determines whether a current integer value was compressed losslessly (e.g., the current indicator=11) or lossily (e.g., the current indicator=00, 01, or 10) using a floating-point compression scheme.

If the current indicator indicates that the current integer was encoded losslessly, then the technique 300 proceeds to 304. At 304, the integer can be decoded using an integer lossless decompression scheme that corresponds to the scheme used by the technique 200 of FIG. 2. In an example, the technique 300 can select the lossless scheme to use based on information encoded in the compressed data 106. As illustrated above with respect to FIG. 2, the information encoded in the compressed data 106 can be, for example, a Huffman code to user. For example, the information encoded in the compressed bitstream can indicate the lossless scheme (e.g., Huffman coding) to use and any parameters (e.g., the Huffman code) of the scheme that the technique 300 is to use.

In an example, and as illustrated by an arrow 307A, the current integer $X_t$ can be provided to a predictor 304 to be used as the prediction $X'_t$ of $X_t$. In an example, the predictor 306 uses a default prediction model, as described with respect to FIG. 2, to obtain $X_t$. As such, and as illustrated by an arrow 307B, the predictor 306 can be directed to obtain $X_t$ using the default predictor. The current integer $X_t$ is then output to the integer values 102.

If the current indicator indicates that the current integer was encoded lossily, then the predictor 306 can use the indicator to determine which prediction model to use to obtain the prediction $X'_t$ of the current integer $X_t$. The prediction $X'_t$ is a value that is in the range $(X_t-0.5, X_t+0.5)$. At 308, the technique 300 reverses the coding (i.e., compression) error. As described above, reversing the coding error can mean rounding the prediction $X'_t$ (i.e., $X_t=\text{round}(X'_t)$) to the nearest integer. Any number of rounding techniques can be used. In an example, the technique 300 rounds half up, where half-way values are round up to the nearest integer. To illustrate, 12.6 rounds up to 13; 12.2 rounds down to 12; 12.5 rounds up to 13; −12.2 rounds up to −12; and −12.9 rounds down to −13. It is to be noted that because the absolute error bound is less than 0.5 (e.g., 0.499 . . . 999), then the encoded value cannot be exactly the middle point (e.g., X+0.5, where X is an integer) between two integers.

FIG. 4 is a flowchart of a technique 400 for decompressing a compressed image to obtain a decompressed image according to an implementation of this disclosure. The technique 400 can be implemented by a decompressor, such as the decompressor 108 of FIG. 1. The technique 400 can be used to decompress the compressed data 106 of FIG. 1, which can be the compressed image including compressed pixel values, to obtain the decompressed image including the integer values 102 of FIG. 1.

The technique 400 can be implemented, for example, as a software program that may be executed by computing devices, such as the computing device 600 of FIG. 6. The software program can include machine-readable instructions that may be stored in a memory such as the memory 604 or the secondary storage 614, and that, when executed by a processor, such as the CPU 602, may cause the computing device to perform the functions of the technique 400. The software program can be stored on a non-transitory computer-readable storage medium. The technique 400 can be implemented using specialized hardware or firmware. Multiple processors, memories, or both, may be used.

At 402, the technique 400 receives, in a compressed stream, compressed pixel values of the compressed image. The compressed stream can be a stored file that includes the compressed image or a stream that is received in real-time from another device. As mentioned above, the compressed pixel values can be the pixel values of a color channel of the image. For example, the pixel values can be the pixel values of a red, green, and/or blue color channel. For example, the pixel values can be luminance and/or chrominance values.

At 404, the technique 400 decompresses a first compressed pixel value of the compressed pixel values using a lossy floating-point decompression scheme to obtain a floating-point pixel value. In an example, and as described above with respect to FIG. 3, the technique 400 can predict the first compressed pixel value using one or more others of the compressed pixel values. For example, the technique 400 can obtain a prediction $X'_t$ using one or more previously predicted values $X'_{t-n}, X'_{t-n-1}, X'_{t-n-2}, \ldots, X'_{t-1}$. In an example, and as also described above, predicting the first compressed pixel value can include obtaining, from the compressed stream, an indication of a prediction function (e.g., model) of the first compressed pixel value and predicting the first compressed pixel value using the prediction function. For example, the technique 400 may include more than one prediction model (e.g. more than one curve fitting model) and the technique 400 obtains from the compressed stream an indication (e.g., a codeword) indicating which of the prediction models to use to obtain $X'_t$.

At 406, the technique 400 rounds the floating-point pixel value to a nearest integer to obtain a pixel value of the decompressed image. In an example, the technique 400 uses half-up rounding. In an example, the technique 400 uses half-down rounding.

At 408, the technique 400 displays or stores the decompressed image. The decompressed image can be stored in a secondary storage, such as the secondary storage 614 of FIG. 6. In an example, the decompressed image can be displayed on a display, such as a display 618 of FIG. 6.

In an example, the technique 400 can further include decompressing a second compressed pixel value of the compressed pixel values using a lossless integer compression scheme. In an example, decompressing the second compressed pixel value can be as described above with respect to 304 of FIG. 3.

FIG. 5 is a flowchart of a technique 500 for compressing an image to obtain a compressed image according to an implementation of this disclosure. The technique 500 can be implemented by a compressor, such as the compressor 104 of FIG. 1. The technique 500 can be used to compress the integer values 102 of FIG. 1, which can be the image including pixel values, to obtain the compressed image including the compressed data 106 of FIG. 1.

The technique 500 can be implemented, for example, as a software program that may be executed by computing devices, such as the computing device 600 of FIG. 6. The software program can include machine-readable instructions that may be stored in a memory such as the memory 604 or the secondary storage 614, and that, when executed by a processor, such as the CPU 602, may cause the computing device to perform the functions of the technique 500. The software program can be stored on a non-transitory computer-readable storage medium. The technique 500 can be implemented using specialized hardware or firmware. Multiple processors, memories, or both, may be used.

At 502, the technique 500 receives the pixel values of the image. The pixel values can be the pixel values of one or more color channels of the image (i.e., color channel pixel values). For example, the pixel values can be the values of the red (or green or blue) color channel of the pixels of the image. The pixel values can be the pixel values of all the pixels of the image or the pixel values of a portion (e.g., block, title, segment, etc.) of the image.

At 504, the technique 500 obtains, using a lossy floating-point compression scheme, a prediction value of a pixel value of the pixel values using respective predictions of others of the pixel values. For example, the pixel value can be $X_t$, the prediction value can be $X'_t$, and the respective predictions of others of the pixel values can be $X'_{t-n}, X'_{t-n-1}, X'_{t-n-2}, \ldots, X'_{t-1}$, as described above. In an example, obtaining the prediction value can include obtaining multiple prediction values using respective prediction models.

At 506, the technique 506 determines (e.g., tests, evaluates, etc.) whether the prediction value is within an error bound. If the prediction is within the error bound, the technique 500 proceeds to 508; if the prediction is not within the error bound, the technique 500 proceeds to 510.

As such, on a condition that a difference between the prediction value and the pixel value is within an error bound, at 508, the technique 500 stores an indication of the prediction value in a compressed stream, which can be a file or a stream to be transmitted to another device. In an example, and as described above, the indication can be an indication of the prediction model used to obtain the prediction value. On a condition that that the difference is not within the error bound, at 510, the technique 500 uses an integer compression scheme to compress the pixel value in the compressed stream. In an example, and as described above, the technique 500 can also include in the compressed stream an indication that the pixel value is compressed using an integer compression scheme.

In an example, the error bound can be less than 0.5 therewith resulting in lossless compression of the image. In another example, the error bound can be greater than 0.5. For example, the error bound can be set based on a range of the pixel values of the image. As there may not be perceptible differences between pixel values that are sufficiently close, some loss may be tolerated. To illustrate, there would not be perceptible differences between the luminance values 254 and 255 or the red values 54 and 53. Thus, in cases where some loss can be tolerated, the technique 500 can use an error bound that is greater than 0.5 therewith resulting in a slightly but imperceptibly lossy compression of the image. The error bound can be set based on a maximum imperceptible difference between pixel values. For example, setting the error bound to 1.49999 may result in a luminance value of 45 being reconstituted (e.g., reconstructed, decompressed, etc.) as either 44 or 46.

At 512, the technique 500 stores or transmits the compressed stream. The compressed image may be stored in a file. The compressed image may be transmitted to another receiving device.

Another technique according to implementations of this disclosure can be used for compressing and decompressing integer values. The technique can be partially implemented by a compressor, such as the compressor 104 of FIG. 1. The technique can be partially implemented by a decompressor, such as the decompressor 108 of FIG. 1. The technique can be implemented, for example, as a software program that may be executed by computing devices, such as the computing device 600 of FIG. 6. The software program can include machine-readable instructions that may be stored in a memory such as the memory 604 or the secondary storage 614, and that, when executed by a processor, such as the CPU 602, may cause the computing device to perform the functions of the technique. The software program can be stored on a non-transitory computer-readable storage medium. The technique can be implemented using specialized hardware or firmware. Multiple processors, memories, or both, may be used.

The technique includes compressing the integer values by receiving the integer values; compressing a first subset of the integer values using a lossy floating-point compression scheme that uses an error bound that is less than 0.5 to obtain a first compressed subset; and storing the first compressed subset in a compressed stream or file. The technique can further include compressing a second subset of the integer values using an integer compression scheme to obtain a second compressed subset; and storing the second compressed subset of the integer values in the compressed stream or file. The integer compression scheme can be a lossless integer compression scheme.

In an example, the integer values can be received from network-connected devices and the integer values can be or can correspond to data from respective sensors of network-connected devices. In an example, the integer values can be pixel values of an image. More specifically, the pixel values can be the values of one of the color components of the pixels. As such, the pixel values of the image can be at least one of the luminance values, the chrominance values, or a color channel values (e.g., red, green, or blue color channel values).

The technique can further include decompressing the integer values by retrieving at least a part of the compressed stream or file; and, in response to an indication, obtained from the at least the part of the compressed stream or file, indicating that an integer value is to be decompressed using a lossy floating-point decompression scheme, obtaining, using the lossy floating-point decompression scheme, an estimate of the integer value and reversing a compression error on the estimate of the integer value to obtain the integer value. The technique can further include, in response to the indication indicating that the integer value is not to be decompressed using the lossy floating-point decompression scheme, using a lossless integer decompression scheme to obtain the integer. The technique can then output the integer. The compression error can be reversed by rounding the estimate of the integer to a nearest integer to obtain the integer.

In an example, the values of each of the color channels can be separately compressed and decompressed as described herein.

In an example, the technique can be used with database compression. The technique can include receiving a command that causes a column of a table of a database that includes only the integer values to be compressed; and compressing at least some of the integer values of the column using a lossy floating-point compression scheme that uses an error bound of 0.5. In an example, the command can be a command to create an index on the column of the database.

Another aspect of the disclosed implementations is an apparatus for compressing an image to obtain a compressed image. The apparatus includes a means for processing the image and a means for outputting the compressed image. The processing includes to receive pixel values of the image; obtain, using a lossy floating-point compression scheme, a prediction value of a pixel value of the pixel values using respective predictions of others of the pixel values; on a condition that a difference between the prediction value and the pixel value is within an error bound, store an indication of the prediction value in a compressed stream; and, on a condition that the difference is not within the error bound, use an integer compression scheme to compress the pixel value in the compressed stream. Outputting includes storing or transmitting the compressed stream.

FIG. 6 is a block diagram of an example of a computing device 600 in accordance with implementations of this disclosure. The computing device 600 can be in the form of a computing system including multiple computing devices, or in the form of one computing device, for example, a mobile phone, a tablet computer, a laptop computer, a notebook computer, a desktop computer, and the like.

A processor 602 in the computing device 600 can be a conventional central processing unit. Alternatively, the processor 602 can be another type of device, or multiple devices, capable of manipulating or processing information now existing or hereafter developed. For example, although the disclosed implementations can be practiced with one processor as shown (e.g., the processor 602), advantages in speed and efficiency can be achieved by using more than one processor.

A memory 604 in computing device 600 can be a read only memory (ROM) device or a random access memory (RAM) device in an implementation. However, other suitable types of storage devices can be used as the memory 604. The memory 604 can include code and data 606 that are accessed by the processor 602 using a bus 612. The memory 604 can further include an operating system 608 and application programs 610, which can include at least one program that permits the processor 602 to perform at least some of the techniques described herein. For example, the application programs 610 can include applications 1 through N, which further include applications and techniques useful in compressing and/or decompressing integer values. For example the application programs 610 can include one or more of the techniques 200, 300, 400, 500, or other techniques disclosed herein or aspects thereof, to implement at least one of compression or decompression of integer values. The computing device 600 can also include a secondary storage 614, which can, for example, be a memory card used with a mobile computing device.

The computing device 600 can also include one or more output devices, such as a display 618. The display 618 may be, in one example, a touch sensitive display that combines a display with a touch sensitive element that is operable to sense touch inputs. The display 618 can be coupled to the processor 602 via the bus 612. Other output devices that permit a user to program or otherwise use the computing device 600 can be provided in addition to or as an alternative to the display 618. When the output device is or includes a display, the display can be implemented in various ways, including by a liquid crystal display (LCD), a cathode-ray tube (CRT) display, or a light emitting diode (LED) display, such as an organic LED (OLED) display.

The computing device 600 can also include or be in communication with an image-sensing device 620, for example, a camera, or any other image-sensing device 620 now existing or hereafter developed that can sense an image such as the image of a user operating the computing device 600. The image-sensing device 620 can be positioned such that it is directed toward the user operating the computing device 600. In an example, the position and optical axis of the image-sensing device 620 can be configured such that the field of vision includes an area that is directly adjacent to the display 618 and from which the display 618 is visible.

The computing device 600 can also include or be in communication with a sound-sensing device 622, for example, a microphone, or any other sound-sensing device now existing or hereafter developed that can sense sounds near the computing device 600. The sound-sensing device 622 can be positioned such that it is directed toward the user operating the computing device 600 and can be configured to receive sounds, for example, speech or other utterances, made by the user while the user operates the computing device 600. The computing device 600 can also include or be in communication with a sound-playing device 624, for example, a speaker, a headset, or any other sound-playing device now existing or hereafter developed that can play sounds as directed by the computing device 600.

Although FIG. 6 depicts the processor 602 and the memory 604 of the computing device 600 as being integrated into one unit, other configurations can be utilized. The operations of the processor 602 can be distributed across multiple machines (wherein individual machines can have one or more processors) that can be coupled directly or across a local area or other network. The memory 604 can be distributed across multiple machines such as a network-based memory or memory in multiple machines performing the operations of the computing device 600. Although depicted here as one bus, the bus 612 of the computing device 600 can be composed of multiple buses. Further, the secondary storage 614 can be directly coupled to the other components of the computing device 600 or can be accessed via a network and can comprise an integrated unit such as a memory card or multiple units such as multiple memory cards. The computing device 600 can thus be implemented in a wide variety of configurations.

For simplicity of explanation, the techniques described herein, such as the techniques 200, 300, 400, and 500 of FIGS. 2-5, respectively, are each depicted and/or described as a series of blocks, steps, or operations. However, the blocks, steps, or operations in accordance with this disclosure can occur in various orders and/or concurrently. Additionally, other steps or operations not presented and described herein may be used. Furthermore, not all illustrated steps or operations may be required to implement a technique in accordance with the disclosed subject matter.

The word "example" is used herein to mean serving as an example, instance, or illustration. Any aspect or design described herein as "example" is not necessarily to be construed as being preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise or clearly indicated otherwise by the context, the statement "X includes A or B" is intended to mean any of the natural inclusive permutations thereof. That is, if X includes A; X includes B; or X includes both A and B, then "X includes A or B" is satisfied under any of the foregoing instances. In addition, the articles "a" and "an" as used in this application and the appended claims should generally be construed to mean "one or more," unless specified otherwise or clearly indicated by the context to be directed to a singular form. Moreover, use of the term "an implementation" or the term "one implementation" throughout this disclosure is not intended to mean the same implementation unless described as such.

Implementations of the computing device 600, and/or any of the components therein described with respect to FIG. 6 and/or any of the components therein described with respect to modules or components of FIG. 1, (and any techniques, algorithms, methods, instructions, etc., stored thereon and/or executed thereby) can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

Further, in one aspect, for example, the techniques described herein can be implemented using a general purpose computer or general purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of this disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or semiconductor device. Other suitable mediums are also available.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for decompressing a compressed image to obtain a decompressed image, comprising:
   receiving, in a compressed stream, compressed pixel values of the compressed image;
   decompressing, from the compressed stream, a first compressed pixel value of the compressed pixel values using a lossy floating-point decompression scheme to obtain a floating-point pixel value;
   rounding the floating-point pixel value to a nearest integer to obtain a pixel value of the decompressed image; and
   displaying or storing the decompressed image.

2. The method of claim 1, wherein decompressing the first compressed pixel value of the compressed pixel values using the lossy floating-point decompression scheme to obtain the floating-point pixel value comprises:
   predicting the first compressed pixel value using one or more others of the compressed pixel values.

3. The method of claim 2, wherein predicting the first compressed pixel value using the one or more others of the compressed pixel values comprises:
   obtaining, from the compressed stream, an indication of a prediction function of the first compressed pixel value; and
   predicting the first compressed pixel value using the prediction function.

4. The method of claim 1, wherein the rounding is a half-up rounding.

5. The method of claim 1, wherein the rounding is a half-down rounding.

6. The method of claim 1, further comprising:
   decompressing a second compressed pixel value of the compressed pixel values using a lossless integer compression scheme.

7. The method of claim 1, further comprising:
   obtaining, from the compressed stream, an indication of whether the first compressed pixel value is compressed using a lossy floating-point compression scheme or a lossless integer compression scheme.

8. The method of claim 7, wherein the decompressing is in response to the indication indicating that the first compressed pixel value is compressed using the lossy floating-point compression scheme.

9. The method of claim 8, wherein the lossy floating-point decompression scheme corresponds to the lossy floating-point compression scheme.

10. The method of claim 9, wherein the wherein the pixel value of the decompressed image is equal to a corresponding pre-compression pixel value.

11. The method of claim 10, further comprising:
    decompressing a second compressed pixel value of the compressed pixel values using the lossless integer compression scheme.

12. An apparatus for compressing an image to obtain a compressed image, comprising:
    a processor configured to:
      receive pixel values of the image;
      obtain, using a lossy floating-point compression scheme, a prediction value of a pixel value of the pixel values using respective predictions of others of the pixel values;
      on a condition that a difference between the prediction value and the pixel value is within an error bound, store an indication of the prediction value in a compressed stream;
      on a condition that the difference is not within the error bound, use an integer compression scheme to compress the pixel value in the compressed stream; and
      store or transmit the compressed stream.

13. The apparatus of claim 12, wherein the pixel values of the image are a color channel pixel values.

14. The apparatus of claim 12, wherein the error bound is less than 0.5.

15. The apparatus of claim 12, wherein the error bound is set based on a range of the pixel values of the image.

16. A non-transitory computer-readable storage medium, comprising executable instructions that, when executed by a processor, facilitate performance of operations for compressing integer values, comprising operations to:
    receive the integer values;
    compress a first subset of the integer values using a lossy floating-point compression scheme that uses an error bound that is less than 0.5 to obtain a first compressed subset; and
    store the first compressed subset in a compressed stream or file.

17. The non-transitory computer-readable storage medium of claim 16, wherein the operations further comprise operations to:
    compress a second subset of the integer values using an integer compression scheme to obtain a second compressed subset; and
    store the second compressed subset of the integer values in the compressed stream or file.

18. The non-transitory computer-readable storage medium of claim 17, wherein the integer compression scheme is a lossless integer compression scheme.

19. The non-transitory computer-readable storage medium of claim 16, wherein the integer values are received from network-connected devices and wherein the integer values correspond to data from respective sensors of network-connected devices.

20. The non-transitory computer-readable storage medium of claim 16, wherein the integer values are pixel values of an image.

21. The non-transitory computer-readable storage medium of claim 20, wherein the pixel values of the image are at least one of luminance values, chrominance values, or a color channel values.

22. The non-transitory computer-readable storage medium of claim 16, wherein the operations further comprise operations to:
retrieve at least a part of the compressed stream or file;
in response to an indication, obtained from the at least the part of the compressed stream or file, indicating that an integer value is to be decompressed using a lossy floating-point decompression scheme:
obtain, using the lossy floating-point decompression scheme, an estimate of the integer value; and
reverse a compression error on the estimate of the integer value to obtain the integer value;
in response to the indication indicating that the integer value is not to be decompressed using the lossy floating-point decompression scheme, use a lossless integer decompression scheme to obtain the integer value; and
output the integer value.

23. The non-transitory computer-readable storage medium of claim 22, wherein to reverse the compression error on the estimate of the integer value to obtain the integer value comprises:
round the estimate of the integer value to a nearest integer to obtain the integer value.

24. The non-transitory computer-readable storage medium of claim 22, wherein the operations further comprises operations to:
receive a command that causes a column of a table of a database comprising the integer values to be compressed; and
compress at least some of the integer values of the column using the lossy floating-point compression scheme that uses the error bound of 0.5.

25. The non-transitory computer-readable storage medium of claim 24, wherein the command is to create an index on the column of the database.

26. An apparatus for compressing an image to obtain a compressed image, comprising:
means for processing the image, the processing includes:
receiving pixel values of the image;
obtaining, using a lossy floating-point compression scheme, a prediction value of a pixel value of the pixel values using respective predictions of others of the pixel values;
on a condition that a difference between the prediction value and the pixel value is within an error bound, storing an indication of the prediction value in a compressed stream; and
on a condition that the difference is not within the error bound, using an integer compression scheme to compress the pixel value in the compressed stream; and
means for outputting the compressed image, the outputting including storing or transmitting the compressed stream.

* * * * *